United States Patent
Omura et al.

(10) Patent No.: US 7,053,549 B2
(45) Date of Patent: May 30, 2006

(54) ORGANIC EL DISPLAY DEVICE

(75) Inventors: Tetsuji Omura, Gifu (JP); Ryuji Nishikawa, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 93 days.

(21) Appl. No.: 10/836,627

(22) Filed: May 3, 2004

(65) Prior Publication Data

US 2005/0023964 A1 Feb. 3, 2005

(30) Foreign Application Priority Data

May 8, 2003 (JP) ............................ 2003-129658

(51) Int. Cl.
*H01J 63/04* (2006.01)

(52) U.S. Cl. ...................... 313/512; 313/506; 257/434; 315/169.3

(58) Field of Classification Search ........ 313/505–512, 313/495–498; 257/432, 434; 315/169.1–169.4
See application file for complete search history.

(56) References Cited

U.S. PATENT DOCUMENTS

| | | | |
|---|---|---|---|
| 6,689,492 B1 * | 2/2004 | Yamazaki et al. ......... | 428/690 |
| 6,690,110 B1 * | 2/2004 | Yamada et al. ............ | 313/506 |
| 6,731,260 B1 * | 5/2004 | Jinno et al. .................... | 345/90 |
| 6,809,390 B1 * | 10/2004 | Toda et al. ................. | 257/434 |
| 6,815,903 B1 * | 11/2004 | Nakanishi ................ | 315/169.3 |
| 6,867,541 B1 * | 3/2005 | Okuyama et al. ........... | 313/506 |
| 6,943,496 B1 * | 9/2005 | Hishida ....................... | 313/512 |

FOREIGN PATENT DOCUMENTS

JP          2002-175029          6/2002

* cited by examiner

*Primary Examiner*—Wilson Lee
(74) *Attorney, Agent, or Firm*—Marrison & Foerster LLP

(57) ABSTRACT

The invention prevents moisture infiltration into a pixel region and improves reliability of an organic EL display device. A plurality of pixels is disposed in a matrix on a device substrate to form a pixel region. Each of the pixels in the pixel region is provided with an organic EL element and a driving transistor for driving the organic EL element. Furthermore, organic interlayer insulating films are formed on the driving transistor and under the organic EL element. The device substrate and a sealing substrate are attached with a sealing member disposed on a peripheral region of the pixel region. The organic interlayer insulating films are separated by a separating region provided between the sealing member and the pixel region.

16 Claims, 7 Drawing Sheets

ORGANIC EL DISPLAY DEVICE

BACKGROUND OF THE INVENTION

1. Field of the Invention

The invention relates to an organic EL (electroluminescent) display device, particularly to an organic EL display device in which a plurality of pixels is disposed on a device substrate to form a pixel region and each of the pixels has an organic EL element and a driving transistor for driving the organic EL element.

2. Description of the Related Art

In recent years, an organic EL display device using organic EL elements has been receiving attention as a new display device to replace a CRT or an LCD. For example, research and development of an EL display device having thin film transistors (hereafter, referred to as TFTs) as switching elements for driving the organic EL elements are being pursued.

FIG. 7 is a partial plan view of such an organic EL display device, and FIG. 8 is a cross-sectional view thereof. A pixel region 200 is disposed on a device glass substrate 100, and a horizontal drive circuit 250 and a vertical drive circuit 260 serving as a drive circuit are disposed on a periphery of the pixel region 200. The vertical drive circuit 260 supplies a gate signal Gn as a pixel selecting signal to each of the pixels in the pixel region 200. The horizontal drive circuit 250 supplies a display signal Dm to each of the pixels in the pixel region 200 based on a horizontal scanning signal. Each of the vertical and horizontal drive circuits is configured of shift resistors.

The plurality of pixels is disposed in a matrix in the pixel region 200. FIG. 7 shows a pixel GS only. A structure of this pixel GS will be explained as follows. A gate signal line 201 supplying the gate signal Gn and a drain signal line 202 supplying the display signal Dm intersect each other. An organic EL element 203, a driving TFT 204 for driving the organic EL element 203, and a pixel selecting TFT 205 for selecting the pixel GS are disposed on a periphery of an intersection of these signal lines.

A drain 204d of the driving TFT 204 is supplied with positive power supply voltage PVdd. A source 204s of the driving TFT 204 is connected with an anode of the organic EL element 203. A gate of the pixel selecting TFT 205 is connected with the gate signal line 201, and supplied with the gate signal Gn from the gate signal line 201. A drain of the pixel selecting TFT 205 is connected with the drain signal line 202, and supplied with the display signal Dm from the drain signal line 202. A source of the pixel selecting TFT 205 is connected with a gate of the driving TFT 204.

The organic EL element 203 includes an anode, a cathode, and an emissive layer formed between the anode and the cathode. The cathode is supplied with negative power supply voltage CV.

Furthermore, the gate of the driving TFT 204 is connected with a storage capacitor 206. That is, one electrode of the storage capacitor 206 is connected with the gate of the driving TFT 204, and another electrode thereof is connected with a storage capacitor electrode 207. The storage capacitor 206 stores the display signal Dm applied to the gate of the driving TFT 204 through the pixel selecting TFT 205 for a field period by storing electric charge corresponding to the display signal Dm.

Operation of the EL display device having the above-described structure will be described. Here, the driving TFT 204 is of P-channel type, and the pixel selecting TFT 205 is of N-channel type.

When the gate signal Gn is high level for a predetermined horizontal period, the pixel selecting TFT 205 turns on. Then, the display signal Dm is applied from the drain signal line 202 to the gate of the driving TFT 204 through the pixel selecting TFT 205. According to the display signal Dm supplied to the gate, conductance between the source and the drain of the driving TFT 204 changes. A drive current corresponding to the changed conductance is supplied to the organic EL element 203 through the driving TFT 204, thereby exiting the organic EL element 203.

The organic EL element 203 degrades its characteristics by absorbing moisture. Therefore, as shown in FIG. 8, the above-described device glass substrate 100 and the sealing glass substrate 300 are attached to each other by using sealing resin 301 made of, for example, an epoxy resin. Furthermore, a concave portion 302 is formed on a surface of the sealing glass substrate 300, which is on the side facing the device glass substrate 100, and a desiccant layer 303 is attached on a bottom of the concave portion 302. This technology is disclosed in the Japanese Patent Application Publication No. 2002-175029.

As shown in FIGS. 7 and 8, an organic interlayer insulating film 208 is formed on and covers the driving TFT 204. The source 204s of the driving TFT 204 is connected with the anode of the organic EL element 203 through a contact hole provided in this organic interlayer insulating film 208. The organic interlayer insulating film 208 has appropriate characteristics as an interlayer insulating film, since it can be formed thick with its low stress and permittivity, and also costs low. On the other hand, however, the organic interlayer insulating film 208 has an adverse characteristic, i.e., high moisture transmittance.

Therefore, moisture infiltrating through the sealing resin 301 from outside of the organic EL display device partially reaches the pixel region 200 through this organic interlayer insulating film 208, thereby degrading the characteristics of the organic EL element 203.

SUMMARY OF THE INVENTION

In an organic EL display device of the invention, a plurality of pixels is disposed in a matrix on a device substrate to form a pixel region. Each of the pixels in the pixel region is provided with an organic EL element and a driving transistor for driving the organic EL element. Furthermore, organic interlayer insulating films are formed on the driving transistor and under the organic EL element. The device substrate and a sealing substrate are attached with a sealing member disposed on a peripheral region of the pixel region. The organic interlayer insulating films are separated by a separating region provided between the sealing member and the pixel region. Accordingly, even when moisture is infiltrated from outside to the organic interlayer insulating film through the sealing resin, the moisture filtration stops at the separating region and the moisture is prevented from infiltrating into the pixel region.

DETAILED DESCRIPTION OF THE INVENTION

Figure 1:
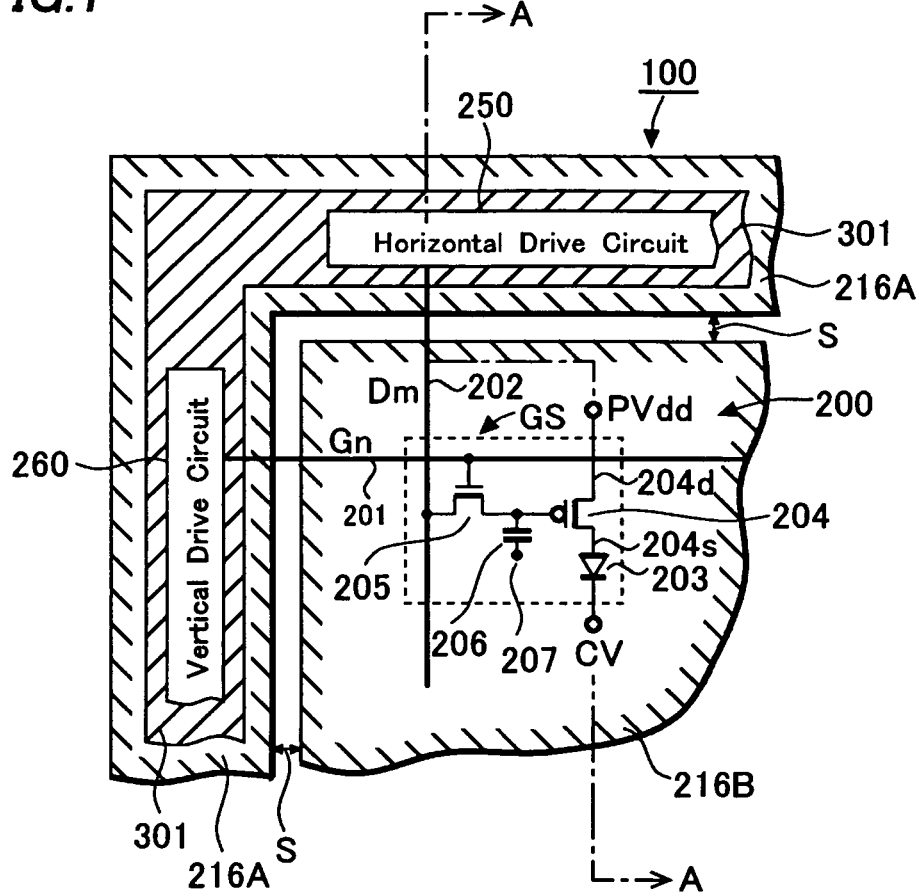
FIG. 1 is a partial plan view of an organic EL display device of a first embodiment of the invention.
Figure 2:
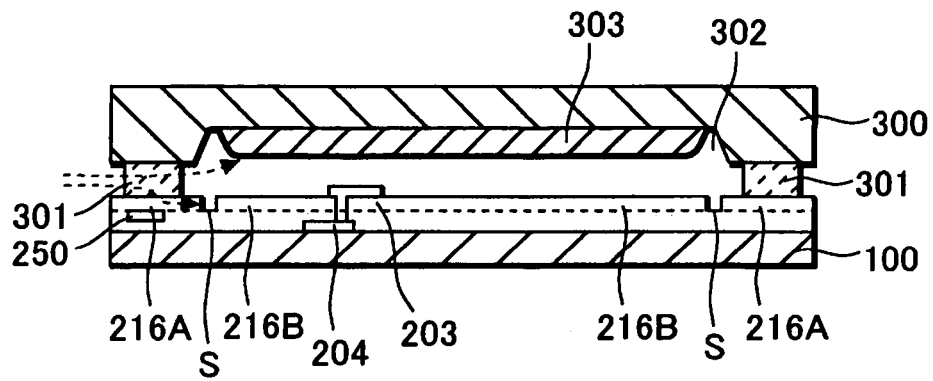
FIG. 2 is a cross-sectional view of the organic EL display device of the first embodiment of the invention along A—A line shown in FIG. 1.
Figure 7:
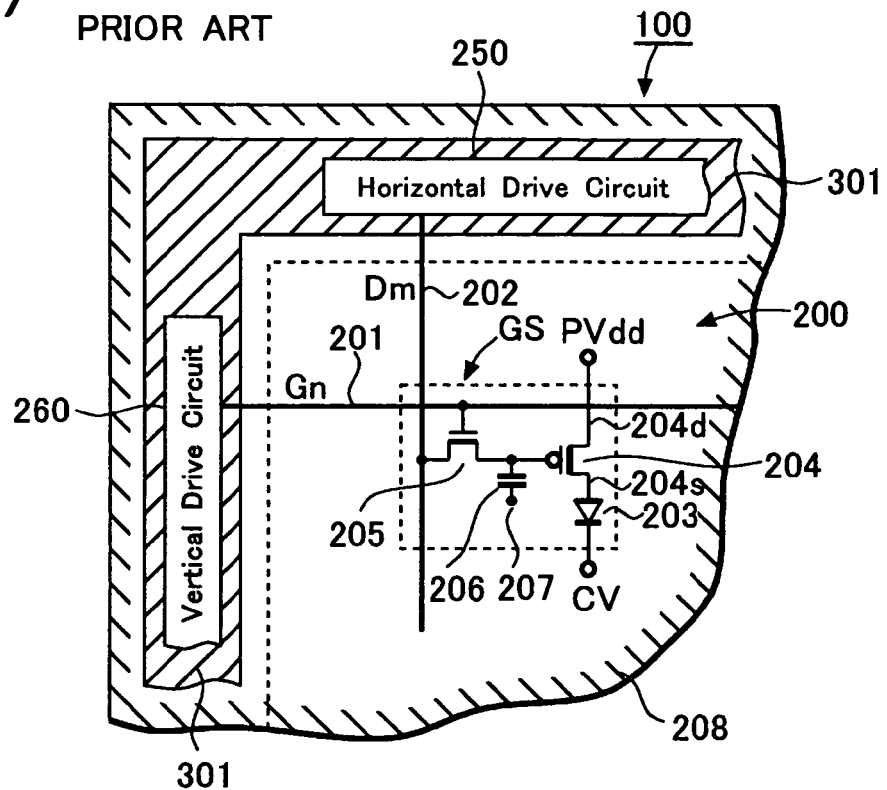
FIG. 7 is a partial plan view of an organic EL display device of a conventional art.
Figure 8:
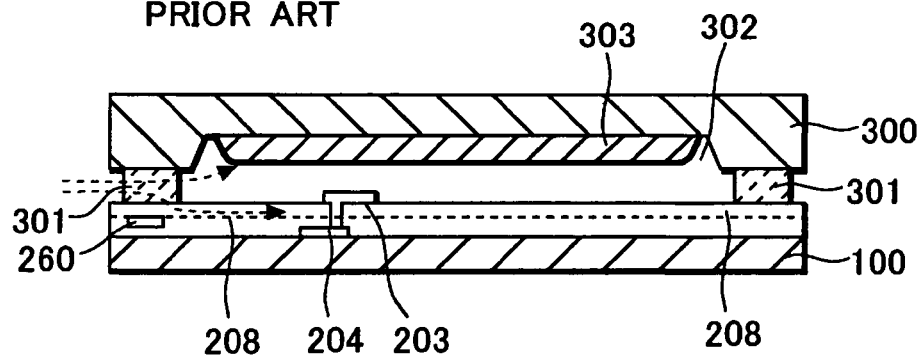
FIG. 8 is a cross-sectional view of the organic EL display device of the conventional art.

An embodiment of the invention will be described with reference to the drawings in detail. FIG. 1 is a partial plan view of an organic EL display device of a first embodiment of the invention, and FIG. 2 is a cross-sectional view thereof. Note that the same numerals are provided to the same components as those of FIGS. 7 and 8, and the descriptions of the components will be omitted.

Organic interlayer insulating films 216A and 216B are formed on a driving TFT 204, and a drain of a driving TFT 204 is connected with an anode of an organic EL element 203 through a contact hole provided in the organic interlayer insulating film 216B. The organic interlayer insulating films 216A and 216B are made of an acrylic resin, for example.

The organic interlayer insulating films 216A and 216B are separated by a separating region S provided between sealing resin 301 and a pixel region 200. That is, the organic interlayer insulating film 216B covers the pixel region 200, and the organic interlayer insulating film 216A covers a peripheral region of the pixel region 200, extending to an edge of the device substrate 100. The organic interlayer insulating films 216A and 216B are not formed in the separating region S.

Figure 9:
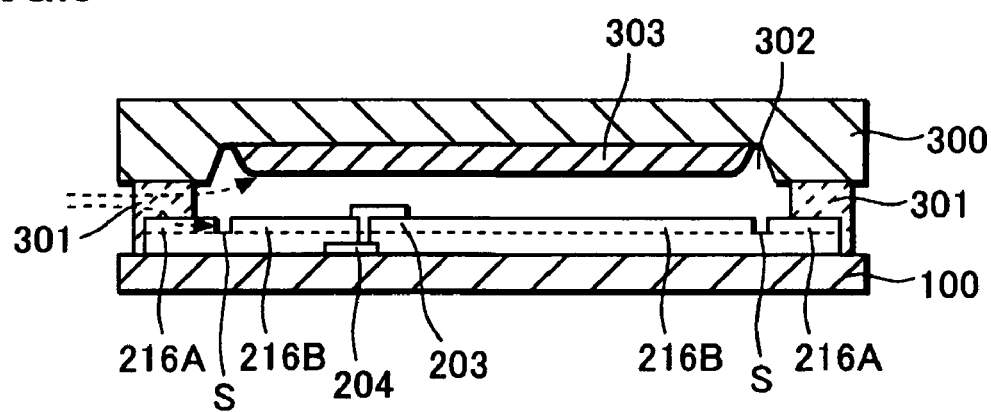
FIG. 9 is a partial cross-sectional view along A—A line in FIG. 1 of a modified organic EL display device of the first embodiment of the invention.

Furthermore, a horizontal drive circuit 250 and a vertical drive circuit 260 are disposed on the periphery of the pixel region 200, and the separating region S is disposed between the horizontal drive circuit 250 and the pixel region 200 and between the vertical drive circuit 260 and the pixel region 200. The sealing resin 301 is interposed between the device substrate 100 and the sealing substrate 300, and disposed in a region including the horizontal drive circuit 250 and the vertical drive circuit 260 as shown in FIG. 1. The edge of the organic interlayer insulating films 216A may be covered by the sealing resin 301 as shown in FIG. 9.

Thus, in this embodiment, the organic interlayer insulating films 216A and 216 B are separated by the separating region S provided between the sealing resin 301 and the pixel region 200. Therefore, even when moisture is infiltrated from outside to the organic interlayer insulating film 216A on the periphery of the pixel region 200 through the sealing resin 301, the moisture filtration stops at the separating region S and the moisture does not infiltrate into the organic interlayer insulating film 216B on the side of the adjacent pixel region 200.

Furthermore, as shown in FIG. 2, moisture entering a space between the device substrate 100 and the sealing substrate 300 through the sealing resin 301 and so on is absorbed by the desiccant layer 303. This prevents moisture infiltration into the organic EL element 203 in the pixel region 200 and degrading of characteristics thereof.

Figure 3:
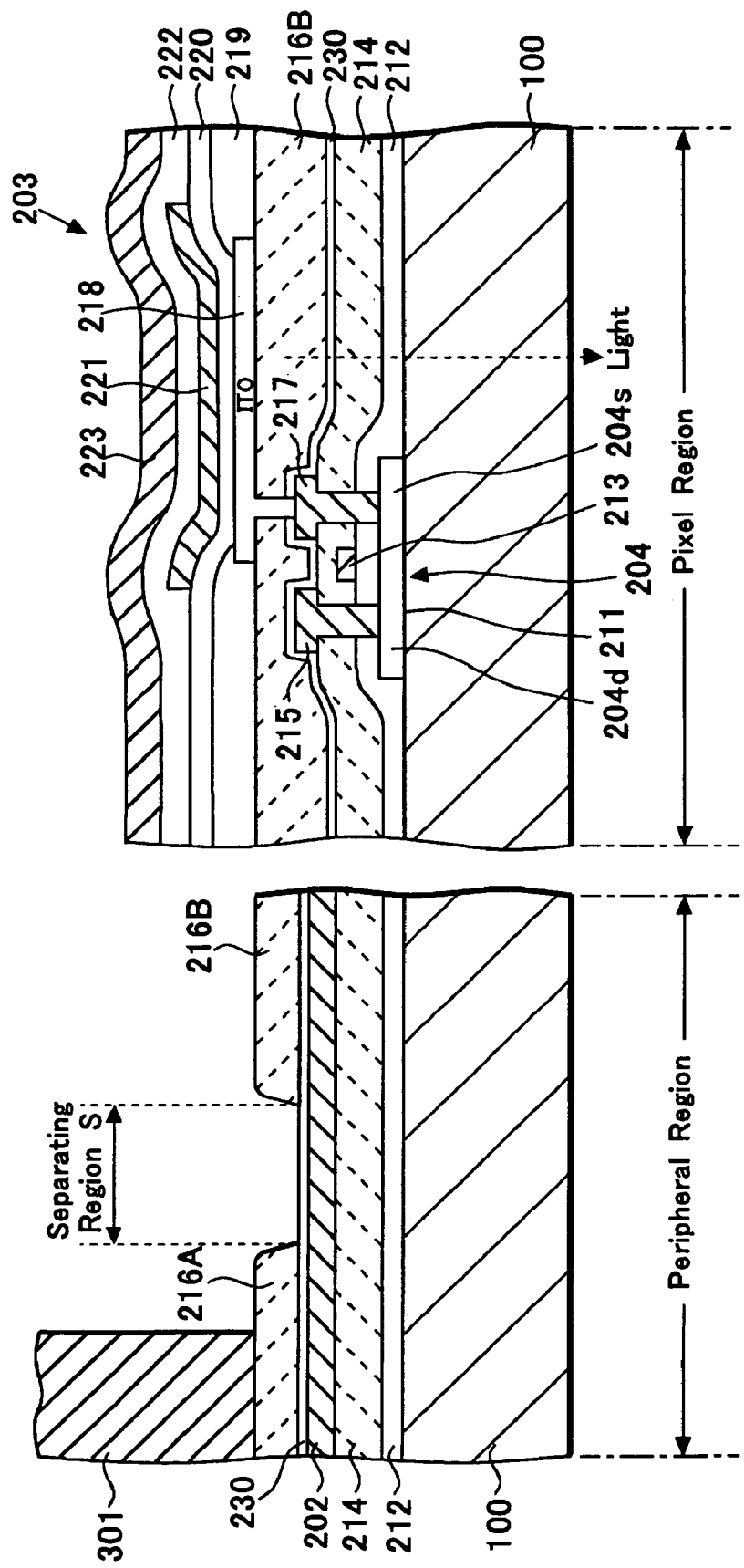
FIG. 3 is a partial cross-sectional view along A—A line in FIG. 1 showing a pixel region and its peripheral region of the organic EL display device of the first embodiment of the invention.

Next, a structure of the pixel region 200 and its peripheral region will be described in more detail. FIG. 3 is a partial cross-sectional view showing the driving TFT 204 of one of the pixels GS in the pixel region 200 and its peripheral region. The driving TFT 204 and the organic EL element 203 are formed on a transparent insulating substrate 100 made of a silica glass or a non-alkali glass. The driving TFT 204 is formed by laminating an active layer 211 formed by poly-crystalizing an amorphous silicon film by irradiation of laser beams, a gate insulating film 212 laminated with an $SiO_2$ film and an SiN film in this order, and a gate electrode 213 made of metal having a high melting point such as Cr (chromium) and Mo (molybdenum), in this order. The active layer 211 is provided with a channel, a source 204s, and a drain 204d, the source 204s and the drain 204d being disposed on each side of the channel.

An first interlayer insulating film 214 laminated with an $SiO_2$ film, an $SiN_x$ film and an $SiO_2$ film in this order is formed on the whole surfaces of the gate insulating film 212 and the active layer 211. A drain electrode 215 is formed by filling with a metal such as Al (aluminum) a contact hole provided correspondingly to the drain 204d. This drain electrode 215 is connected with a driving power supply PVdd. A source electrode 217 is formed by filling with a metal such as Al a contact hole provided correspondingly to the source 204s.

Furthermore, a protection film 230 made of an SiN film and an organic interlayer insulating film 216B as a second interlayer insulating film are formed on a whole surface. This organic interlayer insulating film 216B is formed with the contact hole in a position corresponding to the source 204s of the driving TFT 204. A transparent electrode made of ITO (indium tin oxide), i.e., an anode layer 218 of the organic EL element 203, is formed on the organic interlayer insulating film 216B, being in contact with the source electrode 217 through the contact hole. This anode layer 218 is formed in each of the pixels GS, being isolated as an island.

Furthermore, a third interlayer insulating film 219 is formed on a periphery of the anode layer 218, being removed above the anode layer 218. The organic EL element 203 is formed by laminating the anode layer 218, a hole transport layer 220, an emissive layer 221, an electron transport layer 222, and a cathode layer 223 in this order.

On the other hand, in the peripheral region, the gate insulating film 212 and the first interlayer insulating film 214 in the pixel region 200 extend to the peripheral region of the transparent insulating substrate 100, and a drain signal line 202 is formed on the first interlayer insulating film 214. The drain signal line 202 is formed of Al or Al alloy, and covered with the protection film 230.

The organic interlayer insulating films 216A and 216B are formed on the protection film 230 formed on the drain signal line 202. The organic interlayer insulating film 216B extends from the pixel region 200 to this peripheral region, and the organic interlayer insulating films 216A and 216B are separated by the separating region S. An end of the sealing resin 301 is on the organic interlayer insulating film 216A. The separating region S has a width enough to prevent moisture infiltrated from the sealing resin 301 from infiltrating further into the adjacent organic interlayer insulating film 216B through the organic interlayer insulating film 216A, for example, 5 μm or larger.

Figure 4:
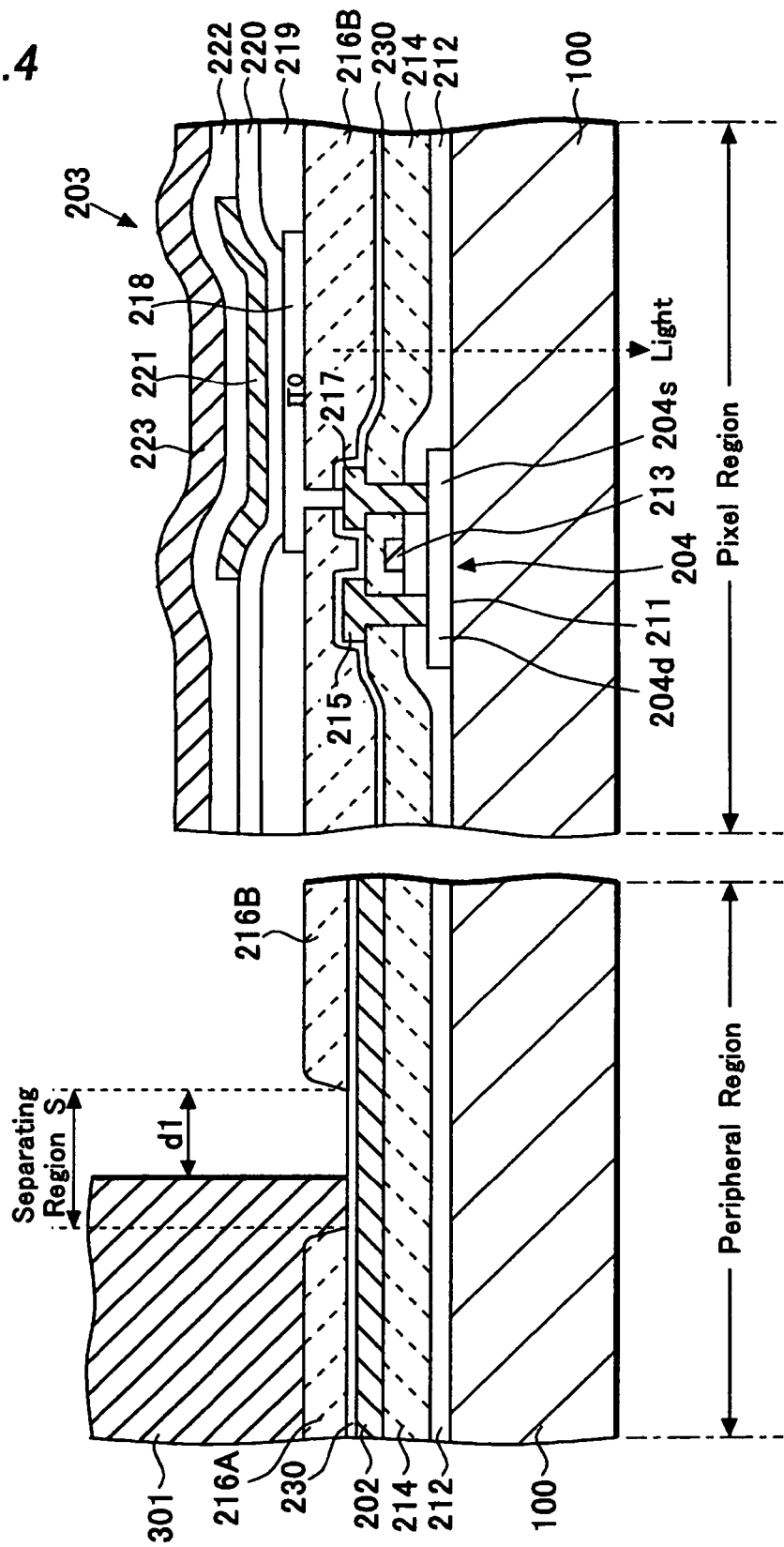
FIG. 4 is a partial cross-sectional view along A—A line in FIG. 1 showing a pixel region and its peripheral region of an organic EL display device of a second embodiment of the invention.

Next, a second embodiment of the invention will be described. Although the end of the sealing resin 301 is positioned on the organic interlayer insulating film 216A in the first embodiment, the end of the sealing resin 301 is positioned inside the separating region S between the organic interlayer insulating films 216A and 216B in this embodiment as shown in FIG. 4. In this structure, too, the end of the sealing resin 301 is kept off from the organic interlayer insulating film 216B on the side of the pixel region 200 by a predetermined distance d1, so that moisture infiltrating in the sealing resin 301 can be prevented from infiltrating further into the organic interlayer insulating film 216B.

Figure 5:
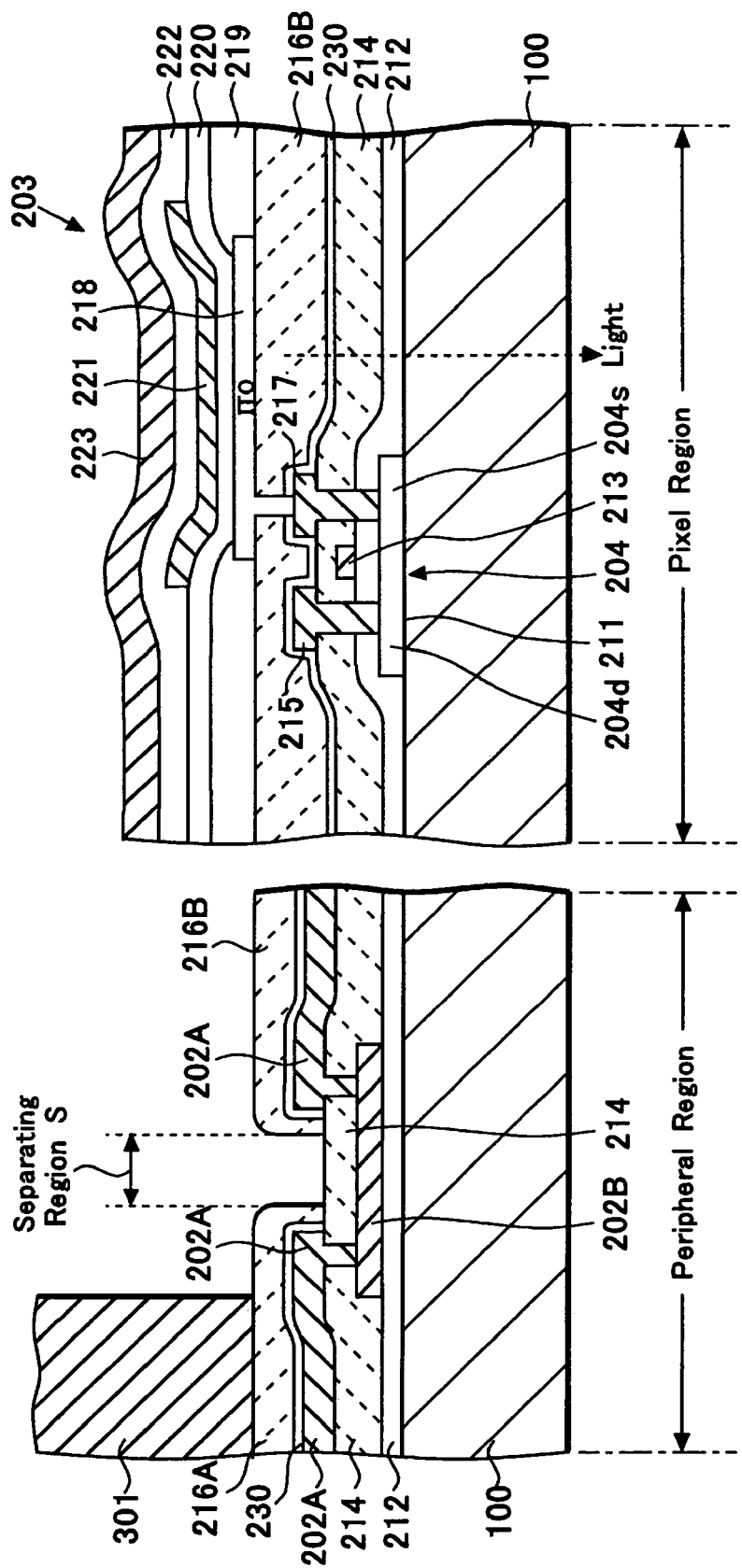
FIG. 5 is a partial cross-sectional view along A—A line in FIG. 1 showing a pixel region and its peripheral region of an organic EL display device of a third embodiment of the invention.

Next, a third embodiment of the invention will be described. Although the drain signal line 202 is formed of a single layer of Al in the first and second embodiments as shown in FIGS. 3 and 4, the drain wiring 202 in this embodiment is formed of upper wiring 202A made of Al, and lower wiring 202B disposed across the first interlayer insulating film 214 from the upper wiring 202A as shown in FIG. 5.

That is, the lower wiring 202B is formed in the same process step as the gate electrode 213 of the driving TFT 204, and made of a same material as the gate electrode 213. Contact holes are formed in both ends of the first interlayer insulating film 214 on the lower wiring 202B, and the upper wiring 202A is connected with both ends of the lower wiring 202B through these contact holes. The separating region S between the organic interlayer insulating films 216A and 216B is located on the first interlayer insulating film 214 formed on the lower wiring 202B, and the organic interlayer insulating films 216A and 216B cover the upper wiring 202A.

This configuration is employed because the drain signal line 202 is not covered with the thick organic interlayer insulating films 216A and 216B at the separating region S in the case where the drain signal line 202 is formed of a single layer of Al as in the first and second embodiments. In this structure of the first and second embodiments, when the anode layer 218 is etched to partially remain at a predetermined region, the drain signal line 202 therebelow may be damaged by etching the protection film 230. In this embodiment, the upper wiring 202A is bypassed to the lower wiring 202B at the separating region S, and the upper wiring 202A is covered with the upper interlayer insulating films 216A and 216B, so that the drain signal line 202 can be prevented from receiving such etching damage.

Figure 6:
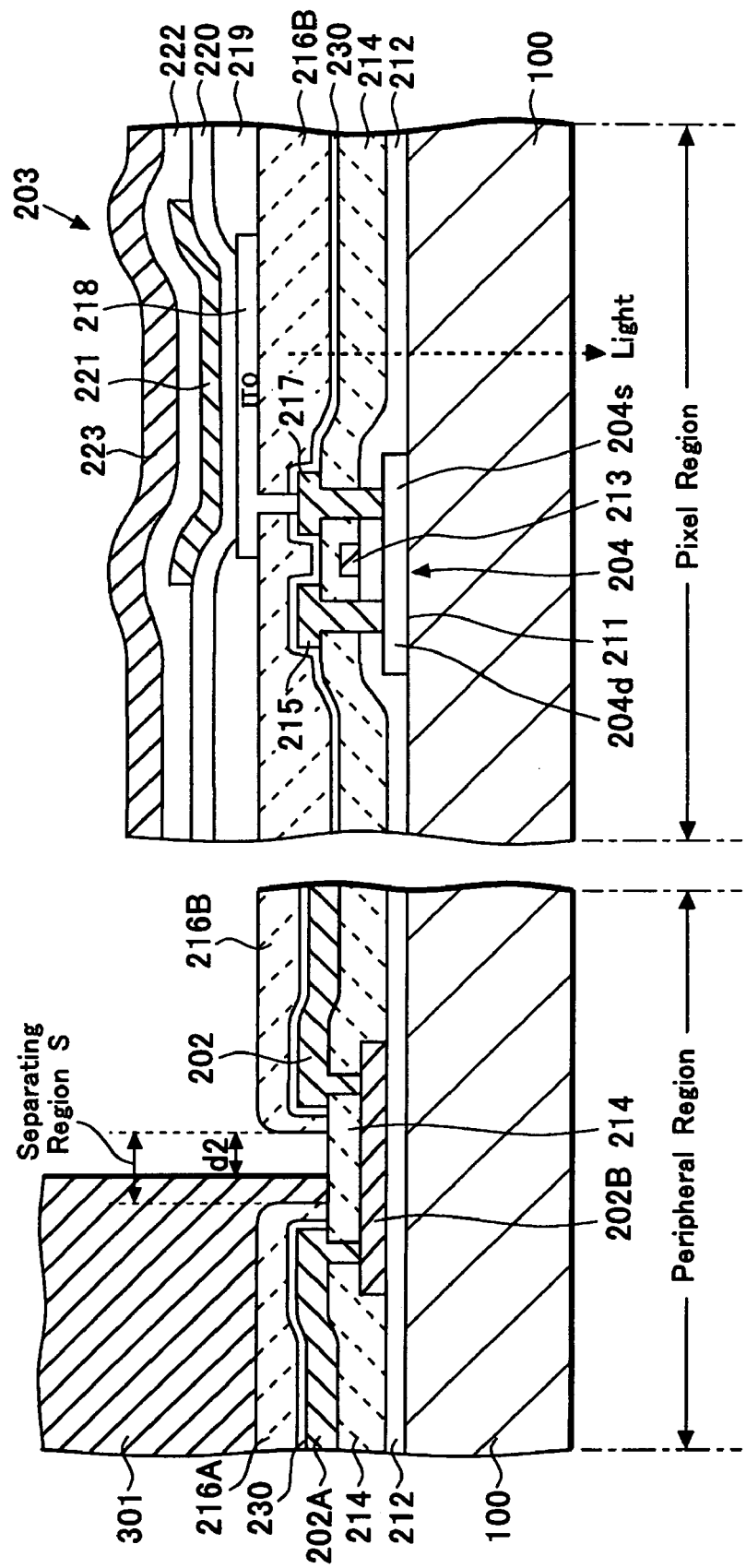
FIG. 6 is a partial cross-sectional view along A—A line in FIG. 1 showing a pixel region and its peripheral region of an organic EL display device of a fourth embodiment of the invention.

Next, a fourth embodiment of the invention will be described. Although the end of the sealing resin 301 is positioned on the organic interlayer insulating film 216A in the third embodiment, the end of the sealing resin 301 is positioned inside the separating region S between the organic interlayer insulating films 216A and 216B in this embodiment as shown in FIG. 6. In this structure, too, the end of the sealing resin 301 is kept off from the organic interlayer insulating film 216B on the side of the pixel region 200 by a predetermined distance d2, so that moisture infiltrating in the sealing resin 301 is prevented from infiltrating into the organic interlayer insulating film 216B.

Although the separating region S for separating the organic interlayer insulating films 216A and 216B is provided in the above-described embodiments, the invention is not limited to such interlayer insulating films. The invention can be applied to an organic insulating film for other use, for example, an organic insulating film to be used as a protection film or a planarization insulating film, and prevent moisture infiltration by the similarly provided separating region.

Furthermore, although the organic interlayer insulating film 216A is disposed under the almost the whole surface of the sealing resin 301 in the above embodiments, the invention does not necessarily have such a structure. As described above, the organic interlayer insulating film 216A has a function of protecting wiring such as the drain signal line 202 from etching damage when the anode layer 218 in the pixel region is etched. That is, the organic interlayer insulating film 216A is not necessarily formed in a region having no wiring made of Al or Al alloy such as the drain signal line 202. Therefore, the organic interlayer insulating film 216A can be patterned in accordance with wiring designs. In this case, although the patterned organic interlayer insulating film 216A is disposed under the sealing resin 301, a separating region having a predetermined width or distance d1 is provided between the organic interlayer insulating film 216B and the organic interlayer insulating film 216A or the sealing resin 301.

Still furthermore, a glass is used as a material of the sealing substrate 300 in the above embodiments, the invention is not limited to such a material and can employ plastic or non-transparent materials. However, it is preferable that the material has a high adhesion to the sealing resin.

Although the organic EL display device of bottom emission type is exemplified for description of the above embodiments, the invention can be applied to an organic EL display device of top emission type.

What is claimed is:

1. An organic EL display device comprising:
    a device substrate;
    a pixel region comprising a plurality of pixels formed on the device substrate, each of the pixels having an organic EL element;
    a sealing substrate;
    a sealing member disposed on the device substrate and outside the pixel region and attaching the device substrate to the sealing substrate;
    a first organic insulating film disposed on the device substrate and within the pixel region; and
    a second organic insulating film disposed on the device substrate and outside the pixel region so that a separation is formed between the first and second organic insulating films,
    wherein the first and second organic insulating films lie in a same plane parallel to the device substrate.

2. The organic EL display device of claim 1, wherein the first organic insulating film or the second organic insulating film is made of an acrylic resin.

3. An organic EL display device comprising:
    a device substrate;
    a pixel region comprising a plurality of pixels formed on the device substrate, each of the pixels having an organic EL element and a driving transistor for driving the organic EL element;
    a first organic interlayer insulating film disposed between the driving transistor and the organic EL element;
    a sealing substrate;
    a sealing member disposed on the device substrate and outside the pixel region and attaching the device substrate to the sealing substrate; and
    a second organic interlayer insulating film disposed on the device substrate and outside the pixel region so that a separation is formed between the first and second organic interlayer insulating films, wherein the first and second organic interlayer insulating films lie in a same plane parallel to the device substrate.

4. The organic EL display device of claim 3, wherein the first organic interlayer insulating film or the second organic interlayer insulating film is made of an acrylic resin.

5. The organic EL display device of claim 3, wherein a horizontal drive circuit is disposed on the device substrate and outside the pixel region, and the separation is located between the horizontal drive circuit and the pixel region.

6. The organic EL display device of claim 3, wherein a vertical drive circuit is disposed on the device substrate and outside the pixel region, and the separation is located between the vertical drive circuit and the pixel region.

7. The organic EL display device of claim 3, wherein the second organic interlayer insulating film disposed under the sealing member is patterned in accordance with a pattern of wiring disposed under the second organic interlayer insulating film.

8. The organic EL display device of claim 5, further comprising a drain signal line extending from the horizontal drive circuit to the pixel region and supplying a display signal to the driving transistor, wherein at least part of the drain signal line is located under the separation between the first and second organic interlayer insulating films.

9. The organic EL display device of claim 8, wherein the drain signal line includes an upper wiring and a lower wiring connected with the upper wiring, the lower wiring is disposed below the separation and covered with a non-organic insulating film, and the upper wiring is covered with the first and second organic interlayer insulating films.

10. An organic EL display device comprising:
a device substrate;
a pixel region comprising a plurality of pixels formed on the device substrate, each of the pixels having an organic EL element and a driving transistor for driving the organic EL element;
a first organic interlayer insulating film disposed between the driving transistor and the organic EL element;
a second organic interlayer insulating film disposed on the device substrate and outside the pixel region so that a separation is formed between the first and second organic interlayer insulating films;
a sealing substrate; and
a sealing member disposed on the device substrate and outside the pixel region so that part of the sealing member partially fills the space between the first and second organic interlayer insulating films, the sealing member attaching the device substrate to the sealing substrate,
wherein the first and second organic interlayer insulating films lie in a same plane parallel to the device substrate.

11. The organic EL display device of claim 10, wherein the first organic interlayer insulating film or the second organic interlayer insulating film is made of an acrylic resin.

12. The organic EL display device of claim 10, wherein a horizontal drive circuit is disposed on the device substrate and outside the pixel region, and the separation is located between the horizontal drive circuit and the pixel region.

13. The organic EL display device of claim 10, wherein a vertical drive circuit is disposed on the device substrate and outside the pixel region, and the separation is located between the vertical drive circuit and the pixel region.

14. The organic EL display device of claim 10, wherein the second organic interlayer insulating film disposed under the sealing member is patterned in accordance with a pattern of wiring disposed under the second organic interlayer insulating film.

15. The organic EL display device of claim 12, further comprising a drain signal line extending from the horizontal drive circuit to the pixel region and supplying a display signal to the driving transistor, wherein at least part of the drain signal line is located under the separation between the first and second organic interlayer insulating films.

16. The organic EL display device of claim 12, wherein the drain signal line includes an upper wiring and a lower wiring connected with the upper wiring, the lower wiring is disposed below the separation and covered with a non-organic insulating film, and the upper wiring is covered with the first and second organic interlayer insulating films.

* * * * *